United States Patent [19]

Scozzafava et al.

[11] Patent Number: 5,073,446
[45] Date of Patent: Dec. 17, 1991

[54] ORGANIC ELECTROLUMINESCENT DEVICE WITH STABILIZING FUSED METAL PARTICLE CATHODE

[75] Inventors: Michael Scozzafava; Ching W. Tang, both of Rochester; Jon E. Littman, Honeoye Falls, all of N.Y.

[73] Assignee: Eastman Kodak Company, Rochester, N.Y.

[21] Appl. No.: 557,857

[22] Filed: Jul. 26, 1990

[51] Int. Cl.$^5$ .................................................. H01J 1/62
[52] U.S. Cl. .................................... 428/323; 313/503; 313/504; 428/330; 428/690; 428/917
[58] Field of Search ................. 313/503, 504; 428/690, 428/917, 323, 330

[56] References Cited

U.S. PATENT DOCUMENTS

| | | | |
|---|---|---|---|
| 3,530,325 | 9/1970 | Mehl et al. | 313/108 |
| 3,621,321 | 11/1971 | Williams | 313/108 A |
| 4,356,429 | 10/1982 | Tang | 313/503 |
| 4,539,507 | 9/1985 | Van Slyke et al. | 313/504 |
| 4,720,432 | 1/1988 | Van Slyke et al. | 428/457 |
| 4,769,292 | 9/1988 | Tang et al. | 428/690 |
| 4,885,211 | 12/1989 | Tang et al. | 428/457 |

Primary Examiner—James J. Seidleck
Attorney, Agent, or Firm—Carl O. Thomas

[57] ABSTRACT

An organic electroluminescent device is disclosed which is protected from dark spot formation. The device is comprised of, in sequence, a support, an anode, an organic electroluminescent medium, and a cathode. The cathode is comprised of an electron injecting layer contacting the organic electroluminescent medium containing a plurality of metals at least one of which has a work function of less than that of indium. The cathode is comprised of a layer of fused metal particles containing at least 80 percent of indium and having a mean diameter of less the 1 μm and a coefficient of variation of less than 20 percent.

18 Claims, 3 Drawing Sheets

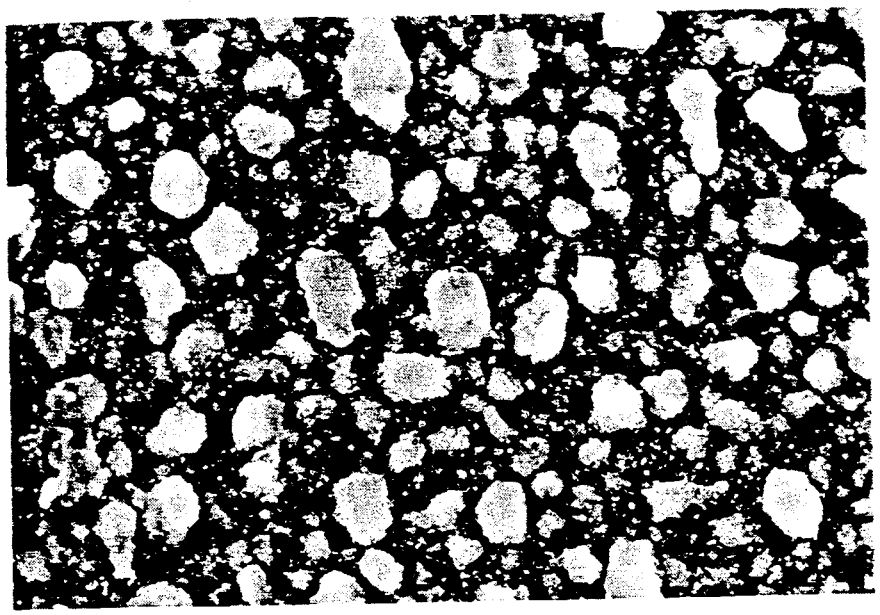
FIG. 2  1 μm
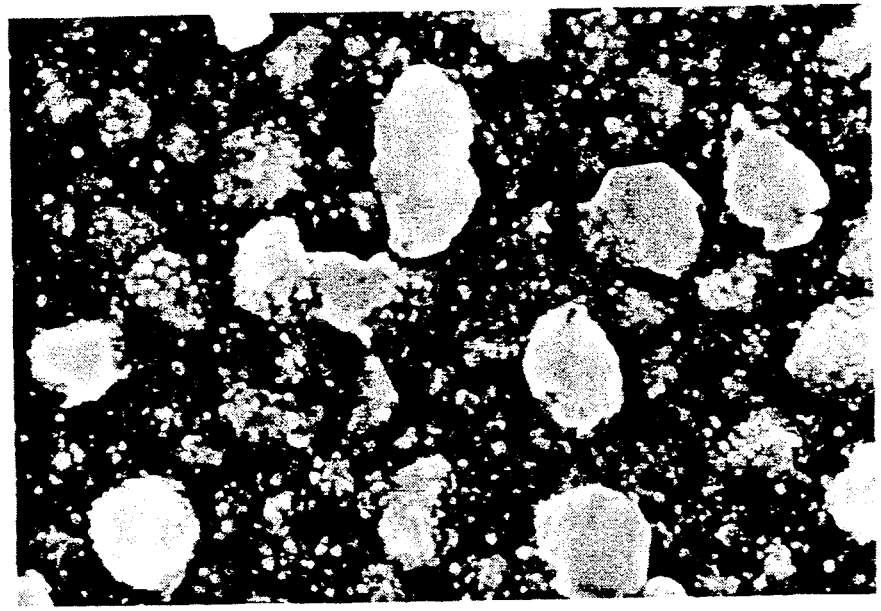
FIG. 3  1 μm

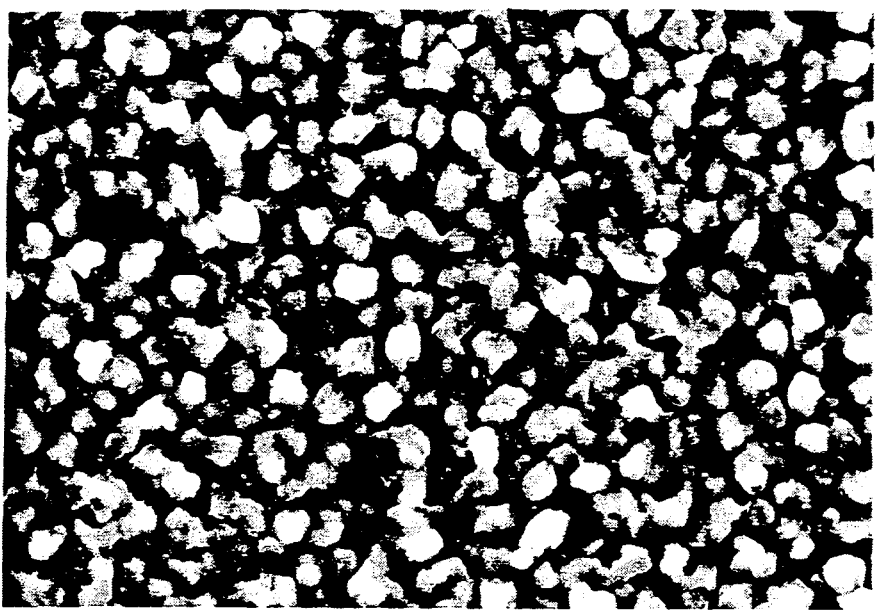
FIG. 4    1μm
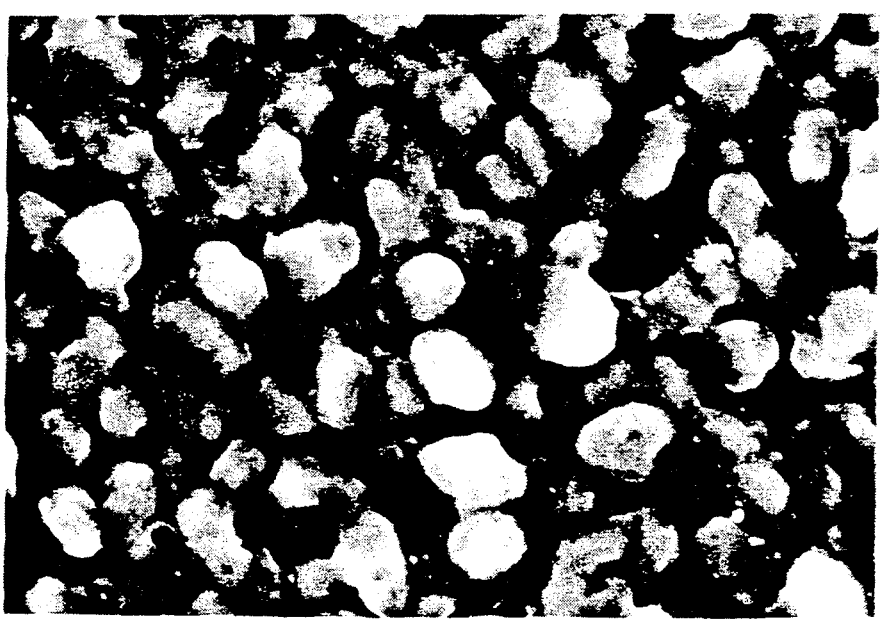
FIG.5    1μm

ORGANIC ELECTROLUMINESCENT DEVICE WITH STABILIZING FUSED METAL PARTICLE CATHODE

FIELD OF THE INVENTION

This invention relates to organic electroluminescent devices. More specifically, this invention relates to devices which emit light from a current conducting organic layer.

BACKGROUND OF THE INVENTION

Electroluminescent devices (hereinafter also referred to as EL devices) contain spaced electrodes separated by an electroluminescent medium that emits electromagnetic radiation, typically light, in response to the application of an electrical potential difference across the electrodes. The electroluminescent medium must not only be capable of luminescing, but must also be capable of fabrication in a continuous form (i.e., must be pin hole free) and must be sufficiently stable to facilitate fabrication and to support device operation.

Initially organic EL devices were fabricated using single crystals of organic materials, as illustrated by Mehl et al U.S. Pat. No. 3,530,325 and Williams U.S. Pat. No. 3,621,321. Single organic crystal EL devices were relatively difficult to fabricate and further did not readily lend themselves to thin film constructions.

In recent years preferred organic EL devices have been constructed employing thin film deposition techniques. Using an anode as a device support, the organic electroluminescent medium has been deposited as one or a combination of thin films followed by the deposition of a cathode, also formed as a thin film deposition. Thus, starting with the anode structure, it is possible to form the entire active structure of an organic EL device by thin film deposition techniques. As employed herein the term "thin film" refers to layer thicknesses of less than 10 $\mu$m, with layer thicknesses of less than about 5 $\mu$m being typical. Examples of organic EL devices containing organic electroluminescent medium and cathode constructions formed by thin film deposition techniques are provided by Tang U.S. Pat. No. 4,356,429, VanSlyke et al U.S. Pat. Nos. 4,539,507 and 4,720,432, and Tang et al U.S. Pat. Nos. 4,769,292 and 4,885,211.

While the art has encountered little difficulty in constructing fully acceptable stable anodes for internal junction organic EL devices, cathode construction has been a matter of extended investigation. In selecting a cathode metal, a balance must be struck between metals having the highest electron injecting efficiencies and those having the highest levels of stability. The highest electron injecting efficiencies are obtained with alkali metals, which are too unstable for convenient use, while metals having the highest stabilities show limited electron injection efficiencies and are, in fact, better suited for anode construction.

Despite improvements in the construction of organic EL devices, a persistent problem has been dark spot formation in environments in which the organic EL device is exposed to some level of moisture in the ambient atmosphere. Microscopic analysis of organic EL devices exhibiting dark spot behavior has revealed oxidation of the cathode occurring at its interface with the organic electroluminescent medium. It is believed that the oxidation of the cathode metal at its interface with the organic electroluminescent medium creates a resistive barrier to current flow in affected areas of the organic EL device. Without current flow in an area of the organic EL device, no electroluminescence can occur, and the result is seen as a dark spot when other areas of the organic EL device are emitting.

Indium has been employed as a cathode for organic EL devices. Tang U.S. Pat. No. 4,356,429 teaches to form cathodes of organic EL devices of metals such as indium, silver, tin, and aluminum. Van Slyke et al U.S. Pat. No. 4,539,507 shows a specific organic EL device construction containing an indium cathode.

Tang et al U.S. Pat. No. 4,885,211 teaches to form the cathodes of organic EL devices of a combination of metals, with at least 50 percent (atomic basis) of the cathode being accounted for by a metal having a work function of less than 4.0 eV. While both magnesium and indium are metals having a work function of less than 4.0 eV, indium has a slightly higher (+3.8 eV) work function than magnesium (+3.7 eV) and for this reason Tang et al prefers electrodes containing predominantly magnesium (since cathodes containing entirely of magnesium are unstable). In Table IV Tang et al compares the efficiency of a Mg:In (11.5%, atomic basis, In) with a pure In cathode. The indium cathode exhibits <40% of the efficiency of the Mg:In cathode. In Example 12 Tang et al demonstrates declining efficiencies as a function of time with Mg:Ag cathodes. Since indium has a lower work function than silver (4.0–4.5 eV), substituting indium for silver in Table V of Tang et al would be expected to produce an inferior EL device.

RELATED PATENT APPLICATIONS

Van Slyke et al (I) U.S. Ser. No. 558,285, concurrently filed and commonly assigned, titled ELECTROLUMINESCENT DEVICE WITH IMPROVED CATHODE, discloses an organic EL device comprised of a cathode containing a combination of magnesium and aluminum.

Van Slyke et al (II) U.S. Ser. No. 561,552, concurrently filed and commonly assigned, titled ELECTROLUMINESCENT DEVICE WITH ORGANIC ELECTROLUMINESCENT MEDIUM, discloses an organic electroluminescent medium including a hole injecting and transporting zone containing an aromatic tertiary amine containing at least two tertiary amine moieties and including attached to a tertiary amine nitrogen atom an aromatic moiety containing at least two fused aromatic rings.

SUMMARY OF THE INVENTION

The present invention has as its purpose to curtail the emergence of dark spots in organic EL devices.

In one aspect this invention is directed to an organic electroluminescent device comprised of, in sequence, a support, an anode, an organic electroluminescent medium, and a cathode consisting essentially of a plurality of metals other than alkali metals, at least one of the metals having a work function less than that of indium. The device is characterized in that the cathode is comprised of fused metal particles containing at least 80 percent indium and having a mean diameter of less than 1 $\mu$m and a coefficient of variation of less than 20 percent.

It is a further object of the invention to provide an organic EL device having improved cathode characteristics that is compatible with formation by thin film deposition techniques.

BRIEF DESCRIPTION OF THE DRAWINGS

FIGS. 2 and 3 are photomicrographs of cathodes failing to satisfy the requirements of the invention.

FIGS. 4 and 5 are photomicrographs of cathodes satisfying the requirements of the invention.

Figure 1:
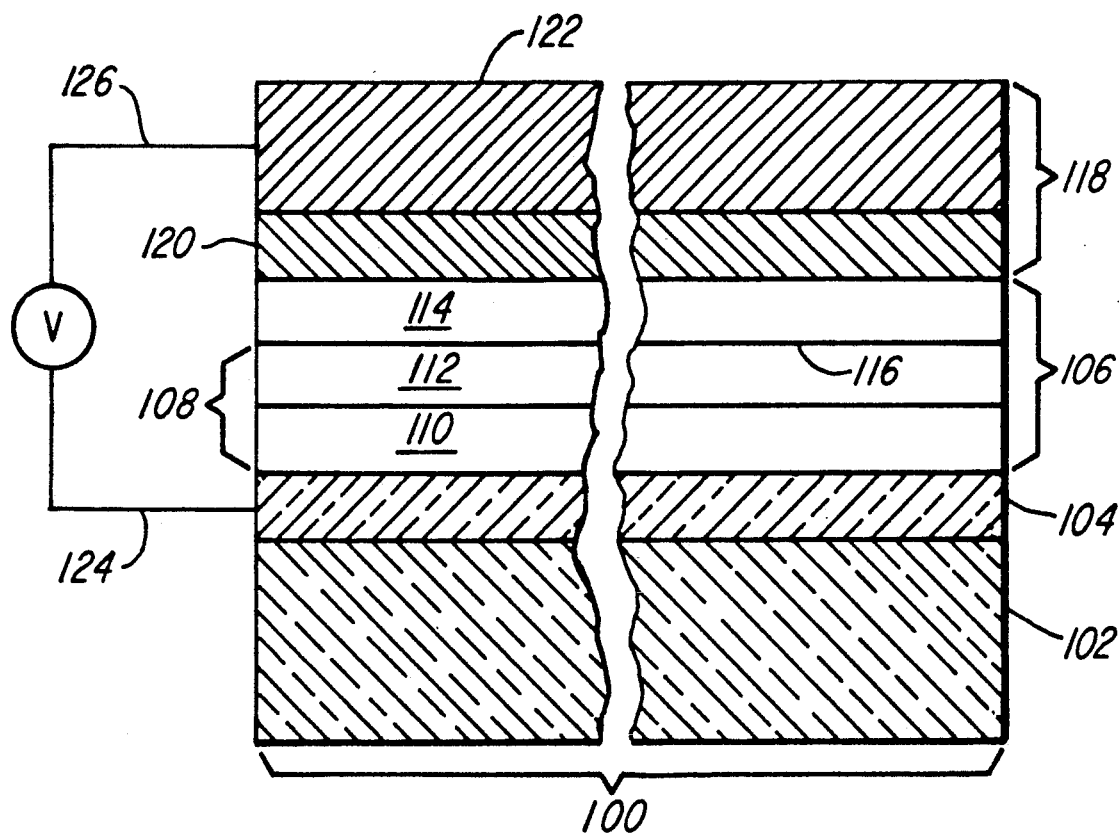
FIG. 1 is schematic diagram of an organic EL device according to the invention.

The drawings are necessarily of a schematic nature, since the thicknesses of the individual layers are too thin and thickness differences of the various elements are too great to permit depiction to scale or to permit convenient proportionate scaling.

DESCRIPTION OF PREFERRED EMBODIMENTS

An organic electroluminescent (EL) device 100 is shown in FIG. 1 consisting of a light transmissive support 102 onto which is coated a light transmissive anode 104. Overlying the anode is an organic electroluminescent medium 106. As shown, the organic electroluminescent medium is divided into (1) a hole injecting and transporting zone 108, which is further divided into (a) a hole injecting layer 110 contacting the anode and (b) an overlying hole transporting layer 112, and (2) an electron injecting and transporting zone 114 forming a junction 116 with the hole transporting layer.

A cathode 118 consisting of an electron injecting layer 120 and a capping layer 122 overlies the organic electroluminescent medium. The electron injecting layer forms an interface with the electron injecting and transporting zone of the organic electroluminescent medium.

In use the anode 104 and cathode 118 are connected to an external power source V by conductors 124 and 126, respectively. The power source can be a continuous direct current or alternating current voltage source or an intermittent current voltage source. Any convenient conventional power source, including any desired switching circuitry, can be employed which is capable of positively biasing the anode with respect to the cathode. Either the anode or cathode can be at ground potential.

The organic EL device can be viewed as a diode which is forward biased when the anode is at a higher potential than the cathode. Under these conditions injection of holes occurs from the anode into the hole injecting layer 110 of the hole injecting and transporting zone 106. The holes are transported across the hole transporting layer 112 and across the junction 116 into the electron injecting and transporting zone 114. Concurrently electrons are injected from the cathode 118 into the electron injecting and transporting zone 114. When a migrating electron drops from its conduction band potential to a valence band in filling a hole, energy is released as light. Depending upon the choice of alternative constructions, the released light can be emitted from the organic electroluminescent medium through one or more edges of the organic electroluminescent medium separating the electrodes, through the anode and support, through the cathode, or through any combination of the foregoing. Since the organic electroluminescent medium is quite thin, it is usually preferred to emit light through one of the two electrodes. In the preferred form of the EL device shown the anode and support are specifically constructed to be light transmissive, thereby facilitating emission through these elements.

Reverse biasing of the electrodes reverses the direction of mobile charge migration, terminating injection of mobile charge carriers across junction 116 and terminating light emission. When an AC power source is employed, the internal junction organic EL devices are forward biased during a portion of each period and reverse biased during the remaining portion of the period.

To allow the organic EL device to operate efficiently the cathode must contain at least one metal having a relative low (less than 4.0 eV) work function in contact with the organic electroluminescent medium. Therefore, the lowest work function metal present in the cathode at the interface is particularly susceptible to oxidation. The presence of moisture in the ambient atmosphere surrounding the organic EL device has been observed to lead to oxidation of the cathode low work function metal at its interface with the organic electroluminescent medium, even when a low work function metal is present in only a limited amount or is overcoated with a higher work function metal.

While the susceptibility of the cathode to oxidation is inherent in the materials and operation of the cathode of an efficient organic EL device, there are additional contributing factors. In constructing organic EL devices by thin film forming techniques, microchannels (microscopic local disruptions) are believed to be present in the cathodes that allow moisture migration through the cathode to its interface with the organic electroluminescent medium. Prior to the present invention all attempts to deposit one or a combination of cathode metals by thin film deposition techniques, either as a single layer or a combination of an injecting layer and a capping layer, have been unsuccessful in overcoming the emergence of dark spots.

The present invention is based on the discovery of a cathode construction for an organic EL device which achieves both high levels of efficiency and improved uniformity of light emission from an organic EL device in the presence of ambient moisture—i.e., curtailed dark spot emergence over time.

The high levels of efficiency are achieved by employing a cathode consisting of a mixture of metals, at least one of which has a lower work function than indium (but excluding, of course, the alkali metals that are too unstable for convenient use). In this respect the invention is implementing the teachings of Tang et al U.S. Pat. No. 4,885,211, cited above, but with the very significant difference that the lower work function metal need not form more than a minor amount of the total cathode metal content, even when a separate capping layer is excluded from consideration.

To improve the uniformity of light emission in the presence of ambient moisture the cathode contains a layer of at least about 80 percent indium deposited as relatively monodispersed fused particles of less than 1 μm in mean diameter.

The cathodes of the invention can be grouped into two overall categories:

(a) The Capped Cathode

The cathode can be constructed of an injecting layer 120 containing a mixture of metals, at least one of which exhibits a lower work function than indium and a capping layer 122 which is comprised of fused metal particles containing at least 80 percent indium and having a mean diameter of less than 1 μm and a coefficient of variation of less than 20 percent. One advantage of this construction is that any of a variety of highly efficient metal combinations can be employed to form the injecting layer. Indium is not required in the injecting layer. A second advantage is that the presence of a metal other than indium in the capping layer is not required. Further, if one or more other metals are present in the capping layer, the additional metal or metals need not be selected on the basis of their work functions—i.e., high (>4.0 eV) and/or low (<4.0 eV) work function metals other than alkali metals can be selected, since the efficiency of electron injection is controlled by the injecting layer.

(b) The Unitary Cathode

The cathode can be constructed as a single layer comprised of fused metal particles containing at least 80 percent indium with at least one other metal (other than an alkali metal) being present that exhibits a work function less than that of indium. In this instance a separate capping layer is not required, since a single layer efficiently performs the separate functions of each. The advantage of a unitary cathode is that it can be fabricated in a single thin film deposition step while still offering the advantages of the invention.

In each of the cathode constructions an essential feature for improving the uniformity of light emission over time in the presence of moisture is the form in which the indium is deposited. Initial thin film depositions of indium both as a unitary cathode and as a capping layer were found to be ineffective to curtail dark spot formation. The present invention arose from the discovery that accelerating the rate of vacuum vapor deposition of indium alters the physical form in which it is deposited and unexpectedly improves the ability of indium as a cathode or cathode component to curtail dark spot formation. Specifically, it was discovered that, when indium is vacuum vapor deposited at a rate of greater 100 Å per sec (preferably greater than 200 Å per sec and optimally greater than 500 Å per sec) indium is deposited in the form of fused particles of less than 1 μm in mean diameter. Further, the fused particles are strikingly different from indium particles deposited at slower deposition rates in that the particles are relatively monodispersed and fused together at their boundaries. On viewing photomicrographs of the fused particles one has the impression of looking at particles that are mostly of similar size. This is in marked contrast to photomicrographs of indium particles deposited at rates of <100 Å per second, typical of the rates of deposition heretofore employed for constructing organic EL devices and, specifically, their cathodes. In quantitative terms, the indium containing fused particles on the cathodes of this invention have a coefficient of variation of less than 20 percent and, preferably, less than 15 percent.

The mean diameter of an indium containing particle is determined by measuring the projected area of an individual particle as it is seen in a photomicrograph. The diameter of the particle is then the diameter of a circle having the same area as the projected area of the particle. By measuring a statistically significant number of particles from photomicrographs it is possible to arrive at a mean particle diameter.

The monodispersity of particles is typically measured in terms of coefficient of variation. As employed herein, the term "coefficient of variation" is employed to mean the standard deviation of particle diameters divided by the mean particle diameter times 100.

Techniques for measuring the mean diameter, standard deviation and coefficient of variation of particle populations having diameters in the range of from about 10 to 0.01 μm are conventional and form no part of this invention. Mean diameter determinations are illustrated by Kofron et al U.S. Pat. No. 4,439,520. Coefficient of variation measurements are illustrated by Wey et al U.S. Pat. No. 4,552,833.

For the purpose of assuring that fused particles in the desired size and monodispersity ranges are formed an indium content of at least 80 percent is maintained in the fused particle layer. (As herein employed, all references to percent are understood to be weight percent, based on total weight, unless otherwise stated.) When the fused particle layer is a cathode capping layer, no metal other than indium need be incorporated. However, any one or combination of other metals (other than alkali metals) which do not interfere with the formation of the fused metal particles are compatible with the practice of the invention. It is specifically preferred to form fused metal particle capping layers that consist essentially of indium, alone, or in combination with a higher work function metal.

When the fused metal particle layer is formed in contact with the organic electroluminescent medium, it is essential to incorporate a minor amount of a metal having a lower work function than indium (other than an alkali metal) to achieve efficient electron injection. Concentrations of lower work function metal of at least 0.05 percent are capable of improving the efficiency of the organic EL device as compared to employing cathodes consisting essentially of indium. Surprisingly, very small concentrations of a lower work function metal are required to obtain substantially all of the increased efficiency which a lower work function metal is capable of imparting. Lower work function metal concentrations of at least 0.1 percent are preferred when the fused metal layer is an electron injecting layer.

Generally the full advantages of introducing one or more other metals in the fused metal particle layer are realized with only limited concentrations. It is therefore preferred that indium constitute at least 90 percent of the fused metal particle layer.

The lower work function metals specifically contemplated for incorporation in the fused metal particle layer include alkaline earth and rare earth metals. Preferred lower work function metals are those which exhibit a work function just slightly less than that of indium—that is, down to about 3.0 eV, such magnesium, scandium, manganese, yttrium, lanthanum, neodymium, samarium, gadolinium, dysprosium, terbium, holmium, erbium, thulium, lutetium, hafnium and thallium. Although magnesium exhibits a work function only 0.1 eV less than that of indium, it exhibits an electron injecting efficiency in an organic EL device almost an order of magnitude greater than that of indium alone. Further, the higher injection efficiencies of magnesium can be largely realized even when the very lowest levels of incorporation identified above are employed.

To be effective in curtailing dark spot formation the fused metal particle layer, whether employed alone in a unitary cathode or as a capping layer, is at least 1000 Å (preferably at least 2000 Å and optimally at least 5000 Å) in thickness. Since the rapidity of deposition produces the desired form of deposition, the thickness of the fused metal particle layer can be increased with minimal effect on fabrication convenience, even when much greater thicknesses than are ordinary considered necessary in forming organic EL devices by thin film deposition techniques are employed. For example, at a demonstrated deposition rate of 1000 Å per second, it requires less than 2 minutes to produce a fused metal particle layer of 10 μm in thickness. Generally the full advantages of the invention are realized with fused metal particle thicknesses of at least 5 μm, with maximum fused metal particle layer thicknesses of about 2 μm being preferred.

Although the improvements in dark spot reduction are surprising and not fully understood, it is believed that the fusion of adjacent particles at their points of contact plays an important role in their effectiveness. Without being bound to any particular theory, one possible explanation of the improvements observed is that the rapid deposition of indium instantaneously creates liquid phase indium that welds the particles into a unitary mass. It is believed that, if a way could be found to increase the proportion of the liquid phase, even to the extent of the individual particles losing their identity, the performance of the cathodes would be generally enhanced.

When the fused metal particle layer forms the capping layer of the cathode, the injecting layer paired with it can take the form of any convenient conventional cathode. To assure a high level of organic EL device efficiency the injecting layer is chosen from among conventional cathodes that contain at least one metal having a lower work function than indium. When the injecting layer is not a fused metal particle layer containing indium of the type described above, the injecting layer is preferably constructed of the combinations of metals taught by Tang et al U.S. Pat. No. 4,885,211. The Mg:Ag cathodes of Tang et al U.S. Pat. No. 4,885,211 constitute one preferred injecting layer construction. Aluminum and magnesium cathodes with magnesium constituting at least 0.05 (preferably at least 0.1) percent and aluminum constituting at least 80 (preferably at least 90) percent constitute another preferred injecting layer construction. The aluminum and magnesium cathodes are the subject matter of the VanSlyke et al (I) concurrently filed patent application cited above.

The anode of the organic EL device can take any convenient conventional form. Typically the anode is constructed of one or a combination of metals having a work function in excess of 4.0 eV. Metals having work functions >4.0 eV are listed by Tang et al U.S. Pat. No. 4,885,211, incorporated by reference above. When, as is preferred, luminescence is intended to occur through the anode, it is preferred to construct the anode of one or a combination of light transmissive metal oxides, such as indium oxide, tin oxide or, optimally, indium tin oxide (ITO).

As employed herein the term "light transmissive" means simply that the layer or element under discussion transmits greater than 50 percent of the light of at least one wavelength it receives and preferably over at least a 100 nm interval. Since both specular (unscattered) and diffused (scattered) emitted light are desirable device outputs, both translucent and transparent (or substantially transparent) materials are useful. In most instances the light transmissive layers or elements of the organic EL device are also colorless or of neutral optical density—that is, exhibit no markedly higher absorption of light in one wavelength range as compared to another. However, it is, of course, recognized that light transmissive electrode supports or separate superimposed films or elements can be tailored in their light absorption properties to act as emission trimming filters, if desired. Such an electrode construction is disclosed, for example, by Fleming U.S. Pat. No. 4,035,686. The light transmissive conductive layers of the electrodes, where fabricated of thicknesses approximating the wavelengths or multiples of the light wavelengths received can act as interference filters.

The organic electroluminescent medium can be chosen from any one or combination of the organic materials taught to form the organic electroluminescent medium of the organic EL devices disclosed by Tang U.S. Pat. No. 4,356,429, VanSlyke et al U.S. Pat. No. 4,539,507, Tang et al U.S. Pat. Nos. 4,769,292 and 4,885,211, each here incorporated by reference. Although the most advantageous constructions are those that employ the zones and layers described above in connection device 100, the organic electroluminescent medium can be a unitary layer.

To achieve high levels of organic EL device efficiency it is contemplated to construct the organic electroluminescent medium of at least two different zones, an electron injecting and transporting zone, which is typically a single layer, and a hole injecting and transporting zone. The hole injecting and transporting zone can be constructed also of a single layer, but it is most efficiently constructed of a hole injecting layer and a hole transporting layer.

In a preferred form of the invention a layer containing a porphyrinic compound forms the hole injecting layer of the internal junction organic EL device. A porphyrinic compound is any compound, natural or synthetic, which is derived from or includes the porphyrin structure. Any of the porphyrinic compounds disclosed by Adler U.S. Pat. No. 3,935,031 or Tang U.S. Pat. No. 4,356,429, the disclosures of which are here incorporated by reference, can be employed.

Preferred porphyrinic compounds are those of structural formula (I):

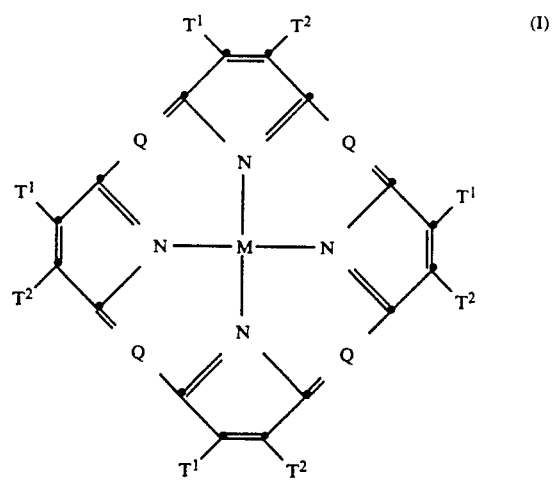

wherein

Q is —N= or —C(R)=;

M is a metal, metal oxide, or metal halide;

R is hydrogen, alkyl, aralkyl, aryl, or alkaryl, and $T^1$ and $T^2$ represent hydrogen or together complete a unsaturated 6 membered ring, which can include substituents, such as alkyl or halogen. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogen for the metal atom, as indicated by formula (II):

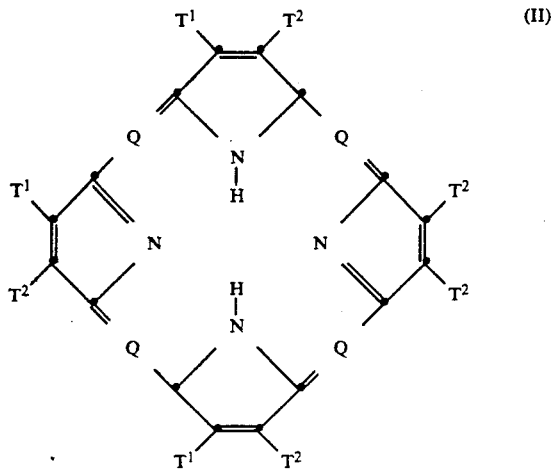

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:
PC-1: Porphine
PC-2: 1,10,15,20-Tetraphenyl-21H,23H-porphine copper (II)
PC-3: 1,10,15,20-Tetraphenyl-21H,23H-porphine zinc (II)
PC-4: 5,10,15,20-Tetrakis(pentafluorophenyl)-21H,23H-porphine
PC-5: Silicon phthalocyanine oxide
PC-6: Aluminum phthalocyanine chloride
PC-7: Phthalocyanine (metal free)
PC-8: Dilithium phthalocyanine
PC-9: Copper tetramethylphthalocyanine
PC-10: Copper phthalocyanine
PC-11: Chromium phthalocyanine fluoride
PC-12: Zinc phthalocyanine
PC-13: Lead phthalocyanine
PC-14: Titanium phthalocyanine oxide
PC-15: Magnesium phthalocyanine
PC-16: Copper octamethylphthalocyanine The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (III):

wherein
$Q^1$ and $Q^2$ are independently aromatic tertiary amine moieties and
G is a linking group such an arylene, cycloalkylene, or alkylene group or a carbon to carbon bond.

A particularly preferred class of triarylamines satisfying structural formula (III) and containing two triarylamine moieties are those satisfying structural formula (IV):

where
$R^1$ and $R^2$ each independently represents a hydrogen atom, an aryl group or alkyl group or $R^1$ and $R^2$ together represent the atoms completing a cycloalkyl group and
$R^3$ and $R^4$ each independently represents an aryl group which is in turn substituted with a diaryl substituted amino group, as indicated by structural formula (V):

wherein $R^5$ and $R^6$ are independently selected aryl groups.

Another preferred class of aromatic tertiary amines are tetraaryldiamines. Preferred tetraaryldiamines include two diarylamino groups, such as indicated by formula (V), linked through an arylene group. Preferred tetraaryldiamines include those represented by formula (VI).

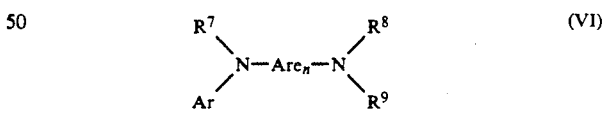

wherein
Are is an arylene group,
n is an integer of from 1 to 4, and
Ar, $R^7$, $R^8$, and $R^9$ are independently selected aryl groups.

The various alkyl, alkylene, aryl, and arylene moieties of the foregoing structural formulae (III), (IV), (V), and (VI) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 5 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

Representative useful aromatic tertiary amines are disclosed by Berwick et al U.S. Pat. No. 4,175,960 and Van Slyke et al U.S. Pat. No. 4,539,507, here incorporated by reference. Berwick et al in addition discloses as useful hole transporting compounds N substituted carbazoles, which can be viewed as ring bridged variants of the diaryl and triarylamines disclosed above.

Following the teachings of VanSlyke et al (II), cited above, it is possible to achieve higher organic EL device stabilities both during short term and extended operation by substituting for one or more of the aryl groups attached directly to a tertiary nitrogen atom in the aromatic tertiary amines described above an aromatic moiety containing at least two fused aromatic rings. The best combination of both short term (0–50 hours) and long term (0–300+ hours) of operation are achieved when the aromatic tertiary amines are those which (1) are comprised of at least two tertiary amine moieties and (2) include attached to a tertiary amine nitrogen atom an aromatic moiety containing at least two fused aromatic rings. The following is a listing of exemplary aromatic compounds containing at least two fused aromatic rings and from 10 to 24 ring carbon atoms:

Naphthalene,
Azulene,
Heptalene,
as-Indacene,
s-Indacene,
Acenaphthylene,
Phenalene,
Phenanthrene,
Anthracene,
Fluoranthrene,
Acephenathrylene,
Aceantrylene,
Triphenylene,
Pyrene,
Chrysene,
Naphthacene,
Pleiadene,
Picene,
Perylene,
Pentaphene,
Hexaphene,
Rubicene, and
Coronene.

The fused aromatic ring moieties of the tertiary amines preferably contain from about 10 to 16 ring carbon atoms. While unsaturated 5 and 7 membered rings can be fused to six membered aromatic rings (i.e., benzene rings) to form useful fused aromatic ring moieties, it is generally preferred that the fused aromatic ring moiety include at least two fused benzene rings. The simplest form of a fused aromatic ring moiety containing two fused benzene rings is naphthalene. Therefore, the preferred aromatic ring moietiesare naphthalene moieties, where the latter is understood to embrace all compounds containing a naphthalene ring structure. In monovalent form the naphthalene moieties are naphthyl moieties, and in their divalent form the naphthalene moieties are naphthylene moieties.

Illustrative of useful aromatic tertiary amines are the following:

ATA-1: 1,1-Bis(4-di-p-tolylaminophenyl)cyclohexane
ATA-2: 1,1-Bis(4-di-p-tolylaminophenyl)-4-phenylcyclohexane
ATA-3: 4,4'-Bis(diphenylamino)quadriphenyl
ATA-4: Bis(4-dimethylamino-2-methylphenyl)-phenylmethane
ATA-5: N,N,N-Tri(p-tolyl)amine
ATA-6: 4-(di-p-tolylamino)-4'-[4(di-p-tolylamino)-styryl]stilbene
ATA-7: N,N,N',N'-Tetra-p-tolyl-4,4'-diaminobiphenyl
ATA-8: N,N,N',N'-Tetraphenyl-4,4'-diaminobiphenyl
ATA-9: N-Phenylcarbazole
ATA-10: Poly(N-vinylcarbazole)
ATA-11: 4,4'-Bis[N-(1-naphthyl)-N-phenylamino]biphenyl
ATA-12: 4,4''-Bis[N-(1-naphthyl)-N-phenylamino]-p-terphenyl
ATA-13: 4,4'-Bis[N-(2-naphthyl)-N-phenylamino]biphenyl
ATA-14: 4,4'-Bis[N-(3-acenaphthenyl)-N-phenylamino]biphenyl
ATA-15: 1,5-Bis[N-(1-naphthyl)-N-phenylamino]naphthalene
ATA-16: 4,4'-Bis[N-(9-anthryl)-N-phenylamino]biphenyl
ATA-17: 4,4''-Bis[N-(1-anthryl)-N-phenylamino]-p-terphenyl
ATA-18: 4,4'-Bis[N-(2-phenanthryl)-N-phenylamino]biphenyl
ATA-19: 4,4'-Bis[N-(8-fluoranthenyl)-N-phenylamino]biphenyl
ATA-20: 4,4'-Bis[N-(2-pyrenyl)-N-phenylamino]biphenyl
ATA-21: 4,4'-Bis[N-(2-naphthacenyl)-N-phenylamino]biphenyl
ATA-22: 4,4'-Bis[N-(2-perylenyl)-N-phenylamino]biphenyl
ATA-23: 4,4'-Bis[N-(1-coronenyl)-N-phenylamino]biphenyl
ATA-24: 2,6-Bis(di-p-tolylamino)naphthalene
ATA-25: 2,6-Bis[di-(1-naphtyl)amino]naphthalene
ATA-26: 2,6-Bis[N-(1-naphthyl)-N-(2-naphthyl)amino]naphthalene
ATA-27: 4,4''-Bis[N,N-di(2-naphthyl)amino]terphenyl
ATA-28: 4,4'-Bis{N-phenyl-N-[4-(1-naphthyl)phenyl]amino}biphenyl
ATA-29: 4,4'-Bis[N-phenyl-N-(2-pyrenyl)amino]biphenyl
ATA-30: 2,6-Bis[N,N-di(2-naphthyl)amine]fluorene
ATA-31: 4,4''-Bis(N,N-di-p-tolylamino)terphenyl
ATA-32: Bis(N-1-naphthyl) (N-2-naphthyl)amine Any conventional electron injecting and transporting compound or compounds can be employed in forming the layer of the organic electroluminescent medium adjacent the cathode. This layer can be formed by historically taught electroluminescent materials, such as anthracene, naphthalene, phenanthrene, pyrene, chrysene, and perylene and other fused ring luminescent materials containing up to about 8 fused rings as illustrated by Gurnee et al U.S. Pat. No. 3,172,862, Gurnee U.S. Pat. No. 3,173,050, Dresner, "Double Injection Electroluminescence in Anthracene", RCA Review, Vol. 30, pp. 322-334, 1969; and Dresner U.S. Pat. No. 3,710,167.

Among electron injecting and transporting zone compounds useful in forming thin films are the butadienes, such as 1,4-diphenylbutadiene and tetraphenylbutadiene; coumarins; and stilbenes, such as trans-stilbene, disclosed by Tang U.S. Pat. No. 4,356,429, cited above.

Still other thin film forming electron injecting and transporting zone compounds which can be used to form the layer adjacent the cathode are optical brighteners, particularly those disclosed by VanSlyke et al U.S. Pat. No. 4,539,507, cited above and here incorporated by reference. Useful optical brighteners include those satisfying structural formulae (VII) and (VIII):

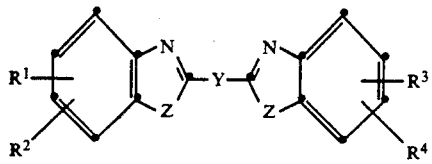

(VII)

or

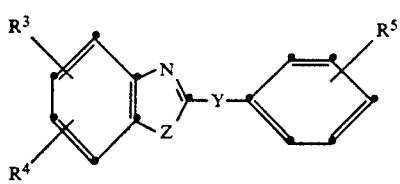

(VIII)

wherein $R^1$, $R^2$, $R^3$, and $R^4$ are individually hydrogen; saturated aliphatic of from 1 to 10 carbon atoms, for example, propyl, t-butyl, heptyl, and the like; aryl of from 6 to 10 carbon atoms, for example, phenyl and naphthyl; or halo such as chloro, fluoro, and the like; or $R^1$ and $R^2$ or $R^3$ and $R^4$ taken together comprise the atoms necessary to complete a fused aromatic ring optionally bearing at least one saturated aliphatic of from 1 to 10 carbon atoms, such as methyl, ethyl, propyl and the like;

$R^5$ is a saturated aliphatic of from 1 to 20 carbon atoms, such as methyl, ethyl, n-eicosyl, and the like; aryl of from 6 to 10 carbon atoms, for example, phenyl and naphthyl; carboxyl; hydrogen; cyano; or halo, for example, chloro, fluoro and the like; provided that in formula (VII) at least two of $R^3$, $R^4$ and $R^5$ are saturated aliphatic of from 3 to 10 carbon atoms, e.g., propyl, butyl, heptyl and the like;

Z is —O—, —NH—, or —S—; and
Y is

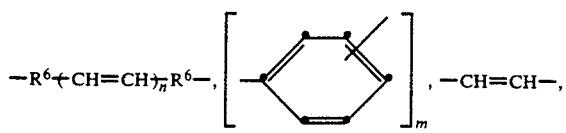

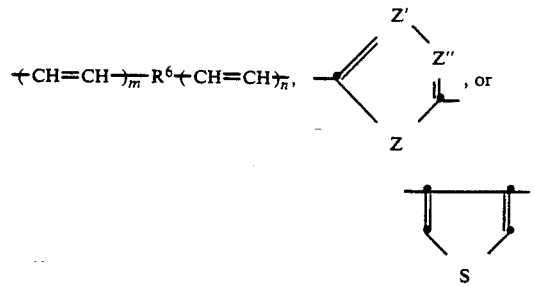

wherein m is an integer of from 0 to 4;

n is arylene of from 6 to 10 carbon atoms, for example, phenylene and naphthylene; and Z' and Z'' are individually N or CH. As used herein "aliphatic" includes substituted aliphatic as well as unsubstituted aliphatic. The substituents in the case of substituted aliphatic include alkyl of from 1 to 5 carbon atoms, for example, methyl, ethyl, propyl and the like; aryl of from 6 to 10 carbon atoms, for example, phenyl and naphthyl; halo, such as chloro, fluoro and the like; nitro; and alkoxy having 1 to 5 carbon atoms, for example, methoxy, ethoxy, propoxy, and the like.

Still other optical brighteners that are contemplated to be useful are listed in Vol. 5 of *Chemistry of Synthetic Dyes*, 1971, pages 618–637 and 640. Those that are not already thin-film-forming can be rendered so by attaching an aliphatic moiety to one or both end rings.

Particularly preferred for use in forming the electron injecting and transporting layers of the organic EL devices of this inventions are metal chelated oxinoid compounds, including chelates of oxine (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (IX):

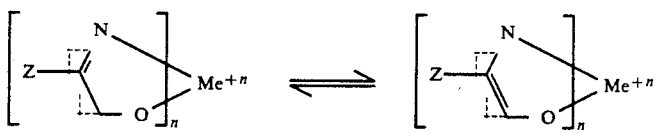

wherein

Me represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

CO-1: Aluminum trisoxine [a.k.a., tris(8-quinolinol) aluminum]
CO-2: Magnesium bisoxine [a.k.a., bis(8-quinolinol) magnesium]
CO-3: Bis[benzo{f}-8-quinolinol] zinc
CO-4: Indium trisoxine [a.k.a., tris(8-quinolinol) indium]
CO-5: Aluminum tris(5-methyloxine) [a.k.a., tris(5-methyl-8-quinolinol) aluminum]
CO-6: Lithium oxine [a.k.a., 8-quinolinol lithium]
CO-7: Gallium tris(5-chlorooxine) [a.k.a., tris(5-chloro-8-quinolinol) gallium]
CO-8: Calcium bis(5-chlorooxine) [a.k.a., bis(5-chloro-8-quinolinol) calcium]
CO-9: Poly[zinc (II)-bis(8-hydroxy-5-quinolinyl)methane]
CO-10: Dilithium epindolidione In the organic EL devices of the invention it is possible to maintain a current density compatible with efficient light emission while employing a relatively low voltage across the electrodes by limiting the total thickness of the organic luminescent medium to less than 1 $\mu m$ (10,000 Angstroms). At a thickness of less than 1 $\mu m$ an applied voltage of 20 volts results in a field potential of greater than $2 \times 10^5$ volts/cm, which is compatible with efficient light emission. An order of magnitude reduction (to 0.1 $\mu m$ or 1000 Angstroms) in thickness of the organic luminescent medium, allowing further reductions in applied voltage and/or increase in the field potential and hence current density, are well within device construction capabilities.

One function which the organic luminescent medium performs is to provide a dielectric barrier to prevent shorting of the electrodes on electrical biasing of the organic EL device. Even a single pin hole extending through the organic electroluminescent medium will allow shorting to occur. Unlike conventional organic EL devices employing a single highly crystalline luminescent material, such as anthracene, for example, the EL devices of this invention are capable of fabrication at very low overall organic luminescent medium thicknesses without shorting. One reason is that the presence of three superimposed layers greatly reduces the chance of pin holes in the layers being aligned to provide a continuous conduction path between the electrodes. This in itself permits one or even two of the layers of the organic luminescent medium to be formed of materials which are not ideally suited for film formation on coating while still achieving acceptable EL device performance and reliability.

The preferred materials for forming the organic electroluminescent medium are each capable of fabrication in the form of a thin film—that is, capable of being fabricated as a continuous layer having a thickness of less than 0.5 $\mu m$ or 5000 Angstroms.

When one or more of the layers of the organic luminescent medium are solvent coated, a film forming polymeric binder can be conveniently co-deposited with the active material to assure a continuous layer free of structural defects, such as pin holes. If employed, a binder must, of course, itself exhibit a high dielectric strength, preferably at least about $2 \times 10^6$ volt/cm. Suitable polymers can be chosen from a wide variety of known solvent cast addition and condensation polymers. Illustrative of suitable addition polymers are polymers and copolymers (including terpolymers) of styrene, t-butylstyrene, N-vinyl carbazole, vinyltoluene, methyl methacrylate, methyl acrylate, acrylonitrile, and vinyl acetate. Illustrative of suitable condensation polymers are polyesters, polycarbonates, polyimides, and polysulfones. To avoid unnecessary dilution of the active material binders are preferably limited to less than 50 percent by weight, based on the total weight of the material forming the layer.

The preferred active materials forming the organic electroluminescent medium are both film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited porphorinic compound as a hole injecting layer, a film forming aromatic tertiary amine as a hole transporting layer, and a chelated oxinoid compound as an electron injecting and transporting layer, thicknesses in the range of from about 50 to 5000 Angstroms are contemplated, with layer thicknesses in the range of from 100 to 2000 Angstroms being preferred. It is generally preferred that the overall thickness of the organic luminescent medium be at least about 1000 Angstroms.

EXAMPLES

The invention and its advantages are further illustrated by the specific examples which follow. The term "atomic percent" indicates the percentage of a particular metal present, based on the total number of metal atoms present. In other words, it is analogous to mole percent, but is based on atoms rather than molecules. The term "cell" as employed in the examples denotes an organic EL device. Examples with a number bearing the suffix E represent embodiments of the invention while Examples with a number bearing the suffix C are included for the purpose of comparing variations.

EXAMPLE 1C

Protective Layer Absent

An organic EL device containing a three layer organic luminescent medium was constructed in the following manner:

a) A transparent anode of indium tin oxide coated glass was polished with 0.05 $\mu m$ alumina abrasive for a few minutes, followed by ultrasonic cleaning in a 1:1 (volume) mixture of isopropyl alcohol and distilled water. It was rinsed with isopropyl alcohol and then immersed in toluene vapor for about 5 minutes.

b) A hole injecting PC-10 (350 Å) layer was deposited on the anode by vacuum deposition. PC-10 was evaporated from a quartz boat using a tungsten filament.

c) A hole transporting ATA-1 (350 Å) layer was then deposited on top of the PC-10 layer. ATA-1 was also evaporated from a quartz boat using a tungsten filament.

d) An electron injecting and transporting CO-1 (600 Å) layer was then deposited on top of the ATA-1 layer. CO-1 was also evaporated from a quartz boat using a tungsten filament.

e) On top of the CO-1 layer was deposited a cathode, consisting of a 250 Å electron injecting layer formed of a 10:1 volume ratio of Mg and Al and a 2000 Å Al capping layer.

The cell was encapsulated by placing a glass cover over the cathode and applying Norland 60 ™ optical adhesive around the periphery of the cell, thereby bonding the glass support bearing the anode to the glass cover. When operated immediately following fabrication the cell exhibited no dark spots—i.e., light emission was uniform over the entire anode surface. After 70 days of storage under ambient laboratory conditions (at or near standard temperature and pressure, with humidity varying with weather conditions), operation of the cell revealed that about 25 percent of the total area over which light was initially emitted was occupied by dark spots.

EXAMPLE 2C

Organic Protective Layer

Example 1C was repeated, except that a 2000 Å protective layer of CO-1 was vacuum vapor deposited over the cathode prior to encapsulating the cell. After 70 days of storage under identical conditions as in Example 1C approximately the same percentage of the initial emitting area was occupied by dark spots as in Example 1C. This showed the organic material CO-1 to be ineffective in itself to reduce dark spot formation.

EXAMPLE 3C

Aluminum Protective Layer

Example 1C was repeated, except that a 2000 Å protective layer of aluminum was vacuum vapor deposited over the cathode prior to encapsulating the cell. In other words, a total of 4000 Å aluminum was deposited over the Mg:Al electron injecting layer. After 70 days of storage under identical conditions as in Example 1C approximately the same percentage of the initial emitting area was occupied by dark spots as in Example 1C. This showed the additional aluminum to be ineffective in itself to reduce dark spot formation.

EXAMPLE 4C

Metal Protective Layer Overcoated with Organic Protective Layer

Example 1C was repeated, except that a 1000 Å protective layer of aluminum was vacuum vapor deposited on the cathode (for a total of 3000 Å aluminum including the capping layer) followed by the vacuum vapor deposition of a 1000 Å protective layer of CO-1 prior to encapsulating the cell. After 70 days of storage under identical conditions as in Example 1C approximately the same percentage of the initial emitting area was occupied by dark spots as in Example 1C. This showed a superimposed combination of a metal protective layer and an organic material protective layer to be ineffective to reduce dark spot formation.

EXAMPLE 5E

Rapidly Deposited Indium Capped Cathode

An organic EL device containing a three layer organic luminescent medium was constructed in the following manner:

a) A transparent anode of ITO coated glass was ultrasonically cleaned in a 3% solution of Deconex ™ 12PA detergent (Borer Chemie AG) for a few minutes. It was then rinsed with deionized water and isopropyl alcohol, and finally immersed in toluene vapor for about 15 minutes.

b) A hole injecting layer (375 Å) of PC-10 was deposited onto the anode by vacuum deposition. It was sublimed from a quartz boat heated by a tungsten filament.

c) A hole transporting layer (375 Å) of ATA-7 was deposited on top of the copper phthalocyanine. It was also evaporated from a quartz boat.

d) An electron injecting and transporting layer (600 Å) of CO-1 was then deposited on top of the hole transporting layer, again by sublimation from a quartz boat.

e) On top of the CO-1 layer was deposited 2000 Å of a 10:1 atomic ratio of Mg and Ag.

f) Over half of layer e) was deposited an indium layer at a rate of 1000 Å per second of 1 μm in thickness.

The cell as initially constructed did not exhibit any dark spots when operated. Thereafter the cell was kept in a controlled 2 percent relative humidity environment and examined periodically for dark spots. After 25 days the portion of the cathode containing the indium layer exhibited dark spots over less than 0.5 percent of its surface area while the portion of the cathode lacking the indium layer exhibited dark spots over 15 percent of its surface area.

EXAMPLE 6C

Slowly Deposited Indium Capped Cathode

Example 5E was repeated, except that the indium was deposited at a rate of less than 100 Å per second. The indium layer in this instance offered no reduction in dark spot formation. Both the area of the cathode coated with indium and that lacking indium exhibited dark spot characteristics similar to the portion of the cell of Example 5E lacking indium.

EXAMPLE 7E

Unitary Rapidly Deposited In:Mg Cathode

A cell was constructed as in Example 5E up to the step of forming the cathode. An In:Mg (150:1 atomic ratio) cathode was formed by codepositing indium at a rate of about 900 Å per second and magnesium at a rate of about 4 to 7 Å per second, where each rate indicates the rate of deposition in the absence of the other metal. The total thickness of the cathode was 4800 Å. When the device was operated immediately following fabrication 5 dark spots in an area of 0.1 cm$^2$ were observed. After storage for 35 days under the conditions described in Example 5E, there was no increase in the number of dark spots and their size was not significantly changed. This demonstrated the capability of the cathode construction to curtail the emergence of dark spots in cells with the passage of time in moisture containing environments.

EXAMPLE 8E

Rapidly Deposited In:Mg Cathode with In Capping Layer

A cell was constructed as in Example 5E up to the step of forming the cathode. An In:Mg (5000:1 atomic ratio) cathode was formed by codepositing indium at a rate of about 1000 Å per second and magnesium at a rate of about 2 Å per second, where each rate indicates the rate of deposition in the absence of the other metal. The total thickness of the cathode was 1 μm. When the device was operated immediately following fabrication 5 dark spots in an area of 0.1 cm$^2$ were observed. After storage for 35 days under the conditions described in Example 5E, there was no increase in the number of dark spots and their size was not significantly changed. This demonstrated the capability of the cathode construction to curtail the emergence of dark spots in cells with the passage of time in moisture containing environments.

The procedure of Example 7E was repeated through the step of forming the In:Mg cathode injecting layer, except that the atomic ratio of In:Mg was increased to 5000:1 to a total cathode layer thickness of 1 μm. An In capping layer was then deposited over the cathode injecting layer at a rate of about 1000 Å per second to a thickness of 1 μm. No darks spots were observed on initial cell operation, and after 40 days of storage in a 2 percent relative humidity environment no dark spots were in evidence, indicating the effectiveness of the cathode construction to curtail dark spot emergence.

EXAMPLES 9C AND 10E

Visualization of Cathode Structure

The purpose of this experiment was to obtain a visual comparison of a rapidly deposited In:Mg cathode satisfying the requirements of the invention capable of curtailing dark spot emergence and a cathode of similar In:Mg content failing to satisfy the requirements of the invention.

Two cathode deposition support structures were produced as follows:

a) A transparent anode of ITO coated glass was ultrasonically cleaned in a 3% solution of Deconex TM 12PA detergent (Borer Chemie AG) for a few minutes. It was then rinsed with deionized water and isopropyl alcohol, and finally immersed in toluene vapor for about 15 minutes.

b) An electron injecting and transporting layer (600 Å) of CO-1 was then deposited on top of the hole transporting layer by sublimation from a quartz boat using a tungsten filament.

A control cathode (9C) was deposited on one of the two support structures by codepositing In and Mg. In was deposited at the rate of 10 Å per second in an amount sufficient to give a coating thickness of 8030 Å. Mg was codeposited at the rate of 0.2 to 0.3 Å per second to give a coating thickness of 185 Å. The deposition rate and thicknesses are quoted for each metal being deposited in the absence of the other. Both metals were in fact deposited together, giving a total cathode thickness of 8115 Å.

An example cathode (10E) was deposited on the remaining of the two support structures by codepositing In and Mg at a higher rate. In was deposited at the rate of about 1000 Å per second in an amount sufficient to give a coating thickness of 8400 Å. Mg was codeposited at the rate of 15 Å per second to give a coating thickness of 120 Å. The deposition rate and thicknesses are quoted for each metal being deposited in the absence of the other. Both metals were in fact deposited together, giving a total cathode thickness of 8520 Å.

FIGS. 2 and 3, as submitted, show the control cathode 9C at magnifications of 10,000× and 20,000×, respectively. Large differences in particles sizes are in evidence. The larger particles appear to be separated from each other, with little or no visual evidence of particle fusion being present. The coefficient of variation of the particles was determined to be 74 percent, which quantitatively corroborates the polydispersity of the particles.

FIGS. 4 and 5, as submitted, show the control cathode 10E at magnifications of 10,000× and 20,000×, respectively. The particles all appear to be roughly similar in size. The largest particles present have diameters of less than 1 μm, with means particle diameters being in the range of about 0.5 μm. The coefficient of variation of the particles was determined to be 14.8 percent.

The invention has been described in detail with particular reference to preferred embodiments thereof, but it will be understood that variations and modifications can be effected within the spirit and scope of the invention.

What is claimed is:

1. An organic electroluminescent device comprised of, in sequence, a support, an anode, an organic electroluminescent medium, and a cathode consisting essentially of a plurality of metals other than alkali metals, at least one of said metals having a work function less than that of indium, characterized in that said cathode is comprised of a layer of fused metal particles containing at least 80 percent indium and having a mean diameter of less than 1 μm and a coefficient of variation of less than 20 percent.

2. An electroluminescent device according to claim 1 further characterized in that indium constitutes at least 90 percent of said fused metal particles.

3. An electroluminescent device according to claim 1 further characterized in that said layer of fused metal particles has a thickness of at least 1000 Å.

4. An organic electroluminescent device according to claim 1 further characterized in that said layer of fused metal particles is positioned in contact with said organic electroluminescent medium and said fused metal particles include at least one metal having a work function less than that of indium.

5. An organic electroluminescent device according to claim 4 further characterized in that indium is present in said fused metal particles in combination with one or more metals each of which have a work function ranging from 3.8 to 3.0 eV.

6. An organic electroluminescent device according to claim 5 further characterized in that said one or more metals have a work function in the range of from 3.8 to 3.5 eV.

7. An organic electroluminescent device according to claim 4 further characterized in that said metal having a work function less than that of indium is present in a concentration of at least 0.05 percent.

8. An organic electroluminescent device according to claim 7 further characterized in that said metal having a work function less than that of indium is present in a concentration of at least 0.1 percent.

9. An organic electroluminescent device according to claim 4 further characterized in that said metal having a work function less than that of indium is magnesium.

10. An organic electroluminescent device according to claim 4 further characterized in that said organic electroluminescent medium is comprised of an electron injecting and transporting zone contacting said cathode.

11. An organic electroluminescent device according to claim 10 further characterized in that electron injecting and transporting zone is comprised of a stilbene or chelated oxinoid compound.

12. An organic electroluminescent device according to claim 11 further characterized in that said chelated oxinoid compound is represented by the formula:

wherein

Me represents a metal;

n is an integer of from 1 to 3; and

Z independently in each occurrence represents the atoms completing a nucleus having at least two fused aromatic rings.

13. An organic electroluminescent device comprised of, in sequence, a support, an anode, an organic electroluminescent medium, and a cathode consisting essentially of a plurality of metals other than alkali metals, at least one of said metals having a work function less than that of indium, characterized in that said cathode is comprised of an electron injecting layer contacting said organic electroluminescent medium and containing at least one metal having a work function less than that of indium and, overlying said injecting layer, a capping layer of fused metal particles containing at least 80 percent indium and free of metal having a lower work function than indium, the particles having a mean diameter of less than 1 $\mu$m and a coefficient of variation of less than 20 percent.

14. An organic electroluminescent device according to claim 13 further characterized in that said electron injecting layer consists essentially of fused metal particles comprised of at least 80 percent indium and at least one metal having a lower work function than indium.

15. An organic electroluminescent device according to claim 14 further characterized in that said electron injecting layer consists essentially of fused metal particles comprised of at least 90 percent indium and at least 0.1 percent magnesium.

16. An organic electroluminescent device comprised of, in sequence, a support, an anode, an organic electroluminescent medium, and a cathode consisting essentially of a plurality of metals other than alkali metals, at least one of said metals having a work function less than that of indium, characterized in that said cathode is comprised of an electron injecting layer containing at least one metal having a work function less than that of indium contacting said organic electroluminescent medium and overlying said electron injecting layer a fused metal particle capping layer which consists essentially of indium, said metal particles having a mean diameter of less than 1 $\mu$m and a coefficient of variation of less than 20 percent.

17. An organic electroluminescent device comprised of, in sequence, a support, an anode, an organic electroluminescent medium, and a cathode consisting essentially of a plurality of metals other than alkali metals, at least one of said metals having a work function less than that of indium, characterized in that said cathode is comprised of an electron injecting layer contacting said organic electroluminescent medium, said electron injecting layer consisting essentially of magnesium and at least one other metal having a higher work function than magnesium, and a fused metal particle capping layer overlying said electron injecting layer, said metal particles containing at least 80 percent indium and having a mean diameter of less than 1 $\mu$m and a coefficient of variation of less than 20 percent.

18. An organic electroluminescent device comprised of, in sequence, a support, an anode, an organic electroluminescent medium, and a cathode consisting essentially of a plurality of metals other than alkali metals, at least one of said metals having a work function less than that of indium, characterized in that said cathode is comprised of an electron injecting layer contacting said organic electroluminescent medium, said electron injecting layer consisting essentially of magnesium and at least one of silver and aluminum and a fused metal particle capping layer overlying said electron injecting layer, said metal particles containing at least 80 percent indium and having a means diameter of less than 1 $\mu$m and a coefficient of variation of less than 20 percent.

* * * * *